United States Patent
Lam et al.

(10) Patent No.: US 8,927,425 B1
(45) Date of Patent: Jan. 6, 2015

(54) SELF-ALIGNED PATTERNING TECHNIQUE FOR SEMICONDUCTOR DEVICE FEATURES

(71) Applicant: International Business Machines Corporation, Armonk, NY (US)

(72) Inventors: Chung H. Lam, Peekskill, NY (US); Jing Li, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/969,625

(22) Filed: Aug. 19, 2013

Related U.S. Application Data

(63) Continuation of application No. 13/931,798, filed on Jun. 28, 2013.

(51) Int. Cl.
*H01L 21/308* (2006.01)

(52) U.S. Cl.
CPC ........ *H01L 21/3086* (2013.01); *H01L 21/3088* (2013.01)
USPC .............. 438/666; 438/98; 438/270; 438/761

(58) Field of Classification Search
USPC .................................... 438/368, 401, 270, 98
See application file for complete search history.

(56) References Cited

U.S. PATENT DOCUMENTS

2013/0334607 A1 * 12/2013 Fumitake et al. ............. 257/368

OTHER PUBLICATIONS

Yi-Shiang Chang et al., Pattern Decomposition and Process Integration of Self-Aligned Double Patterning for 30nm Node NAND Flash Process and Beyond, Proc. of SPIE vol. 7274 72743E-1 (2009).

* cited by examiner

*Primary Examiner* — Mamadou Diallo
(74) *Attorney, Agent, or Firm* — Ido Tuchman; Louis J. Percello

(57) ABSTRACT

A method for fabricating a semiconductor device utilizing a plurality of masks and spacers. The method includes forming parallel first trenches in a substrate using a first lithographic process. The substrate includes sidewalls adjacent to the parallel first trenches. Forming first spacers adjacent to the sidewalls. Removing the sidewalls, which in part includes using a second lithographic process. Forming second spacers adjacent to the first spacers, resulting in spacer ridges. Etching portions of the substrate between the spacer ridges resulting in second trenches.

1 Claim, 11 Drawing Sheets

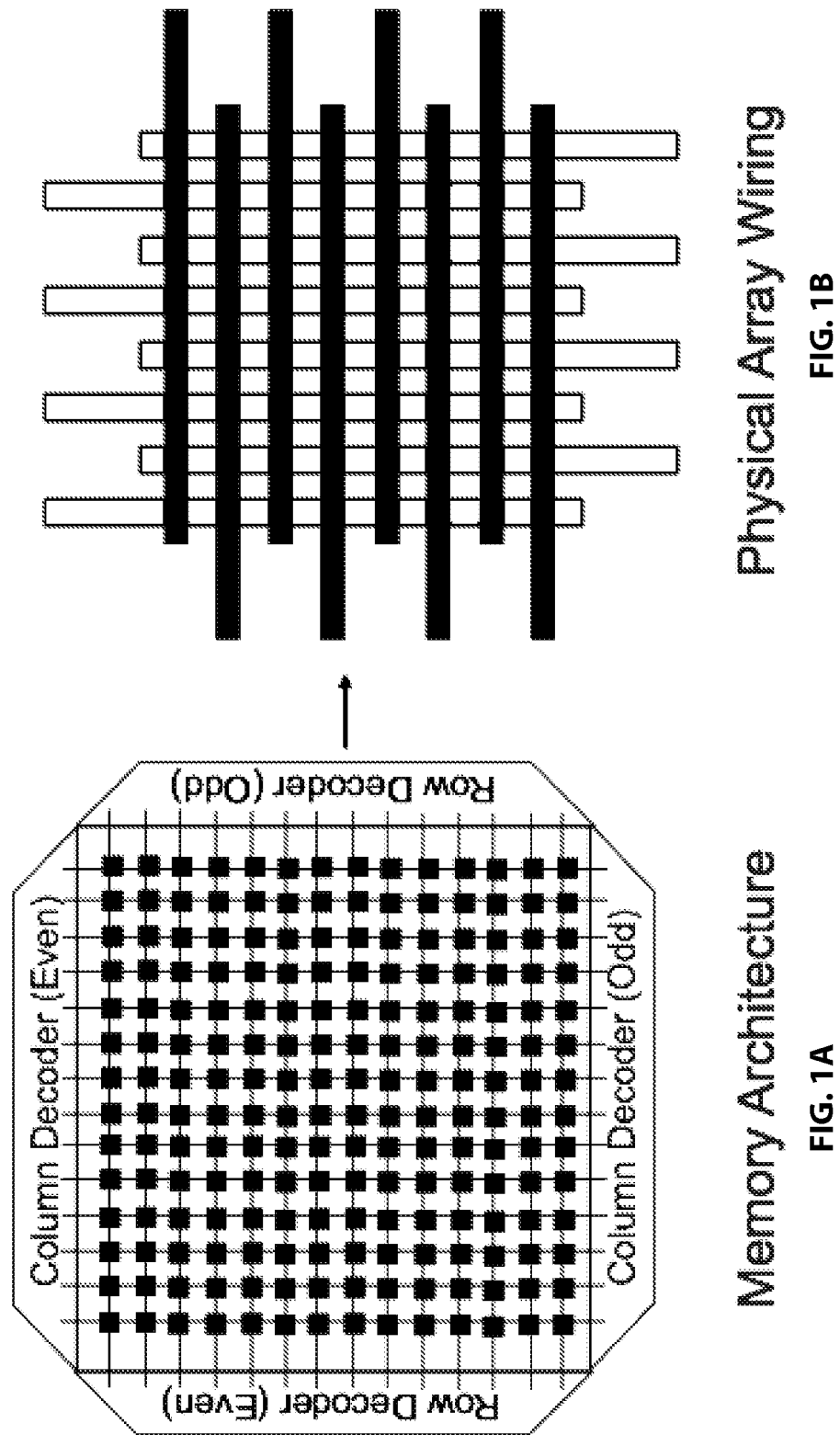

SELF-ALIGNED PATTERNING TECHNIQUE FOR SEMICONDUCTOR DEVICE FEATURES

CROSS-REFERENCE TO RELATED APPLICATIONS

This application claims priority under 35 U.S.C. §120 to U.S. patent application Ser. No. 13/931,798 filed Jun. 28, 2013, the entire text of which is specifically incorporated by reference herein.

BACKGROUND

This invention relates to the fabrication of semiconductor devices. More particularly, the present invention relates to a method for fabricating sub-lithographic semiconductor device features.

In general, semiconductor device scaling may be restricted by the current resolution limits of lithography technology. With the ongoing down-scaling of semiconductor devices and drive to increase feature density, Double Patterning Technology has been introduced as a solution to the resolution limits of current lithography equipment. Double Patterning Technology has allowed fabrication of device features beyond the lithographic printing limit utilizing a plurality masking, etch, and/or spacing techniques.

However, in the formation of metal device features, such as array wiring and connections between integrated circuitry, are highly sensitive to variations in uniformity and precision. Conventional Double Patterning Techniques may present problems in accuracy and uniformity. Thus the efficiency of conventional Double Patterning methods for such sensitive features is reduced.

BRIEF SUMMARY

An aspect of the invention is a method for fabricating semiconductor device features. The method includes forming a plurality of parallel first trenches in a substrate using a first lithographic process. The substrate includes sidewalls adjacent to the parallel first trenches. The method also includes forming a plurality of first spacers adjacent to the sidewalls of the substrate. The method also includes removing the sidewalls of the substrate, which in part includes using a second lithographic process. The method also includes forming a plurality of second spacers adjacent to the first spacers. The adjacent first and second spacers are in physical contact and result in a plurality of spacer ridges. Furthermore, the method includes etching portions of the substrate between the spacer ridges, which results in a plurality of second trenches.

BRIEF DESCRIPTIONS OF DRAWINGS

FIG. 1A is a diagram of an example memory array structure, in accordance to one embodiment of the present invention.

FIG. 1B is a diagram of the physical array wiring for an example memory array, in accordance to one embodiment of the present invention.

DETAILED DESCRIPTION

The present invention is described with reference to various embodiments of the invention. Throughout the description of the invention, reference is made to FIGS. 1A through 9B.

Additionally, relative terms, such as "horizontal", "vertical", "top", "over", and "down" are employed with respects to other elements in the described embodiments and figures. Such terms are meant only to describe the referenced embodiments. Therefore, the present invention encompasses alternative orientations of the suggested embodiments.

Embodiments of the present invention provide possible methods of fabricating semiconductor device features. An aspect of the present invention provides a method of utilizing two spacers to define the trenches in which a semiconductor device feature is formed, such that the trenches are both uniformly spaced and are uniform in width.

FIG. 1A is a diagram of an example memory array structure, in accordance to one embodiment of the present invention. The individual memory cells are represented by the black squares and the connecting wiring is represented by the parallel horizontal and vertical lines. Each of the wires contact column and row decoders in the margins. FIG. 1B is a top-down diagram of the physical array wiring for an example memory array, in accordance to one embodiment of the present invention.

Figure 2A:
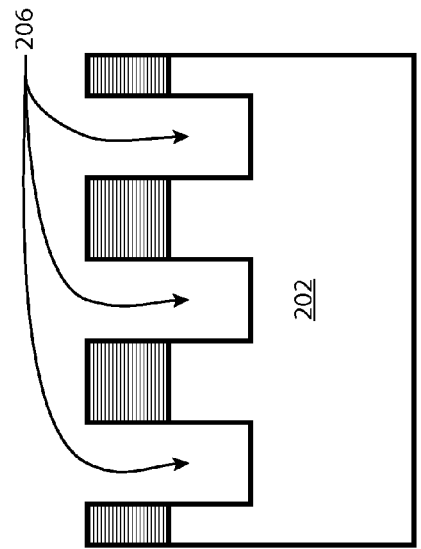
FIG. 2A is a diagram of an intermediary step depicting a first masking layer on top of a substrate, in accordance to one embodiment of the present invention.

The diagrams from FIG. 2A through FIG. 6 are cross-sectional views of intermediary steps during fabrication of a memory array, in accordance to one embodiment of the present invention. FIG. 2A schematically depicts a first masking layer 204 on top of a substrate 202. In some embodiments, the substrate 202 is comprised of a silicon-oxide (SiO) material. FIG. 2B schematically depicts a plurality of parallel first trenches 206 etched into the substrate 202. FIG. 2C schematically depicts the substrate 202 including sidewalls 208, after removal of the first masking layer 204. FIG. 2D schematically depicts a first spacer layer 210 deposited on the substrate 202. In some embodiments, the first spacer layer 210 is comprised of a silicon-nitride (SiN) or a silicon-oxide (SiO) material.

Figure 3B:
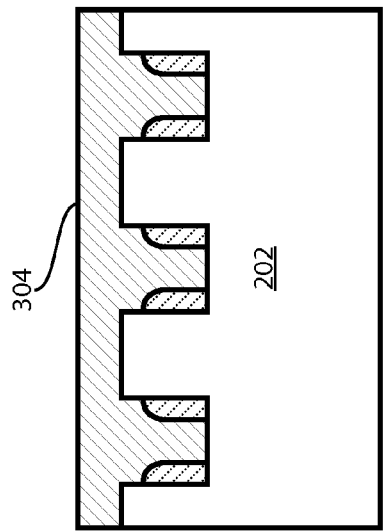
FIG. 3B is a diagram of an intermediary step depicting a filler layer deposited over a substrate and first spacers, in accordance to one embodiment of the present invention.
Figure 3D:
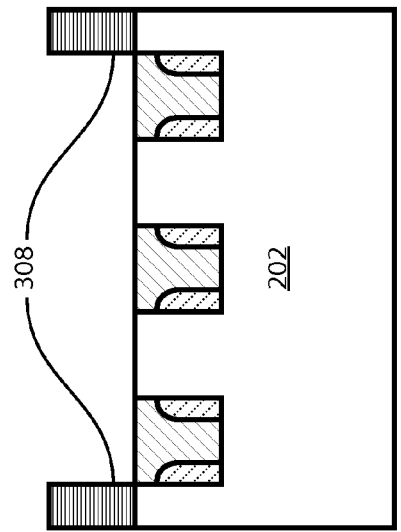
FIG. 3D is a diagram of an intermediary step depicting a second masking layer on top of a substrate, in accordance to one embodiment of the present invention.
Figure 3A:
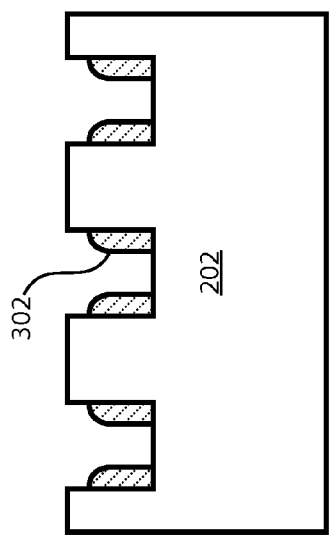
FIG. 3A is a diagram of an intermediary step depicting a plurality of first spacers adjacent to sidewalls, in accordance to one embodiment of the present invention.
Figure 3C:
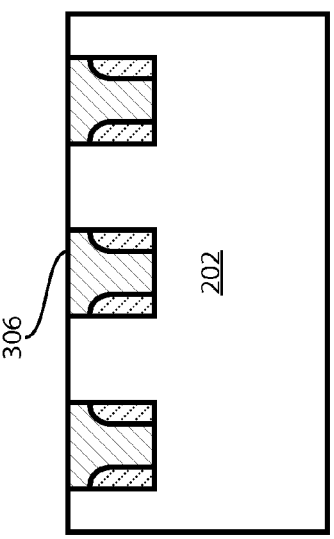
FIG. 3C is a diagram of an intermediary step depicting a plurality of fillers in a parallel first trenches, in accordance to one embodiment of the present invention.

FIG. 3A schematically depicts a plurality of first spacers 302 adjacent to the sidewalls 208. The first spacers 302 are formed from etching portions of the first spacer layer 210. One skilled in the art would recognize that such a formation can be achieved with a variety of processes including a range of anisotropic etches. FIG. 3B schematically depicts a filler layer 304 deposited over the substrate 202 and first spacers 302. In some embodiments, the filler layer 304 is comprised of a polycrystalline silicon material. FIG. 3C schematically depicts a plurality of fillers 306 in the parallel first trenches 206. In this embodiment, the filler layer 304 is polished down to the substrate sidewall 208, without exposing the first spacers 302. FIG. 3D schematically depicts a second masking layer 308 on top of the substrate 202.

Figure 4A:
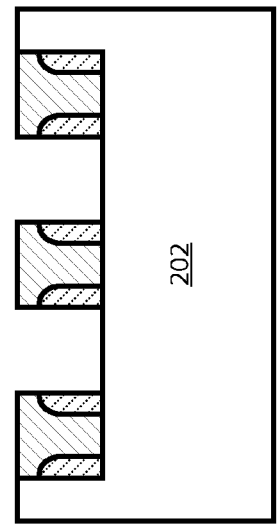
FIG. 4A is a diagram of an intermediary step depicting a substrate after removing a sidewalls, in accordance to one embodiment of the present invention.
Figure 4B:
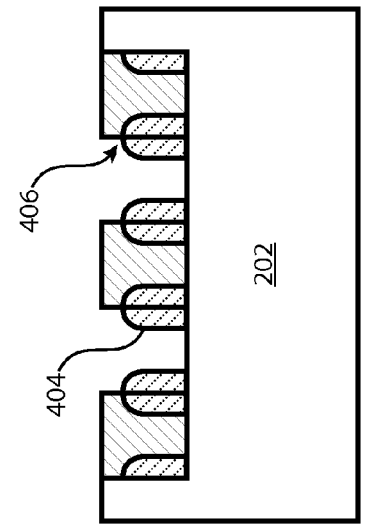
FIG. 4B is a diagram of an intermediary step depicting a substrate after removal of a second masking layer, in accordance to one embodiment of the present invention.
Figure 4C:
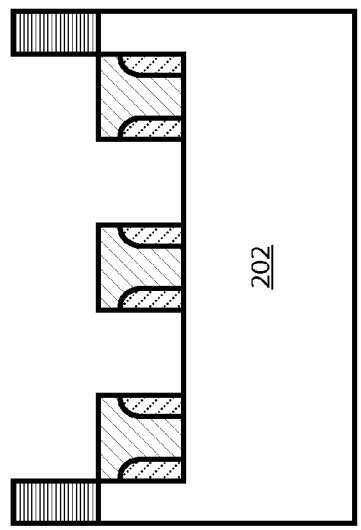
FIG. 4C is a diagram of an intermediary step depicting a second spacer layer deposited over a substrate and fillers, in accordance to one embodiment of the present invention.
Figure 4D:
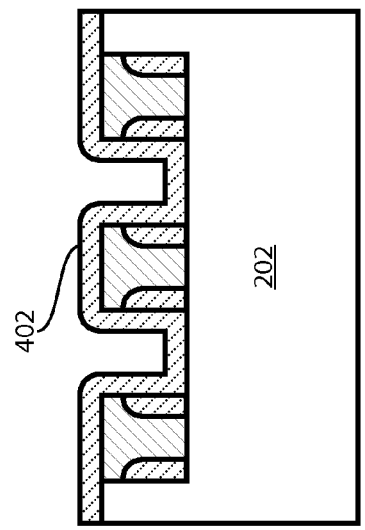
FIG. 4D is a diagram of an intermediary step depicting a plurality of second spacers formed adjacent to first spacers, in accordance to one embodiment of the present invention.

FIG. 4A schematically depicts the substrate 202 after removing the sidewalls 208 with an etch. In this embodiment, the depth of the etch is substantially equal to the depth of the parallel first trenches 206. FIG. 4B schematically depicts the second masking layer 308 removed from the substrate 202. FIG. 4C schematically depicts a second spacer layer 402 deposited over the substrate 202 and fillers 306. In some embodiments, the second spacer layer 402 is comprised of a silicon-nitride (SiN) or a silicon-oxide (SiO) material. FIG. 4D schematically depicts a plurality of second spacers 404 adjacent to the first spacers 302, resulting in a plurality of spacer ridges 406. In some embodiments, the width of the spacer ridges 406 are substantially less than the lithographic resolution limit of 40~45 nm half-pitch, and the spacer ridges 406 are spaced substantially less than the lithographic resolution limit.

Figure 5B:
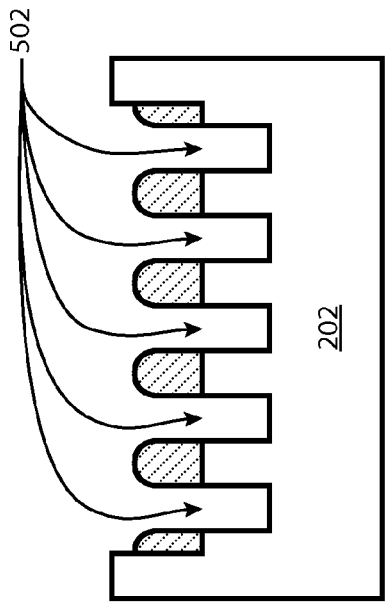
FIG. 5B is a diagram of an intermediary step depicting second trenches etched into a substrate, in accordance to one embodiment of the present invention.
Figure 5D:
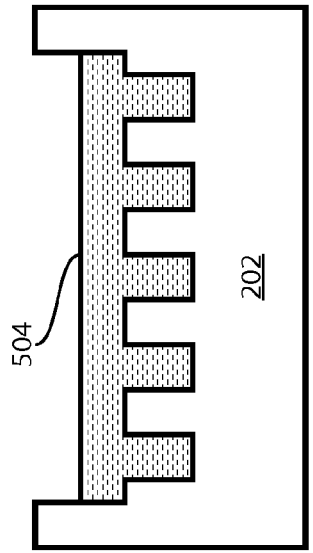
FIG. 5D is a diagram of an intermediary step depicting a wiring material deposited over a substrate, in accordance to one embodiment of the present invention.
Figure 5A:
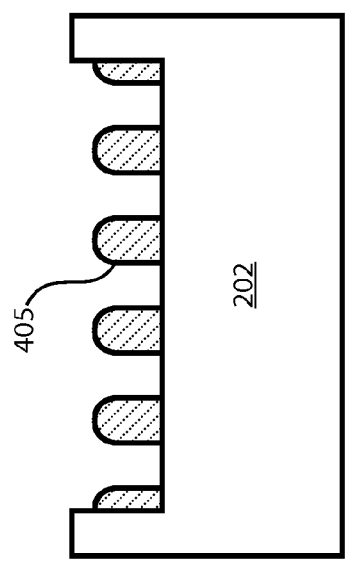
FIG. 5A is a diagram of an intermediary step depicting spacer ridges on a substrate, in accordance to one embodiment of the present invention.
Figure 5C:
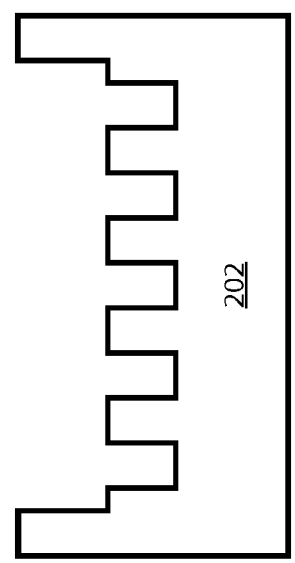
FIG. 5C is a diagram of an intermediary step depicting a substrate with first spacers and second spacers removed, in accordance to one embodiment of the present invention.

FIG. 5A schematically depicts the spacer ridges 406 on the substrate 202, after removal of the fillers 306. One skilled in the arts would recognize that the fillers 306 can be removed with a variety of processes including a selective etch process. FIG. 5B schematically depicts a plurality of second trenches 502 etched into the substrate 202. FIG. 5C schematically depicts the substrate 202 with the first spacers 302 and second spacers 404 removed. One skilled in the art would recognize that the first and second spacers may be removed with a variety of processes including a range of selective etches. FIG. 5D schematically depicts a wiring material 504 deposited over the substrate 202.

Figure 6:
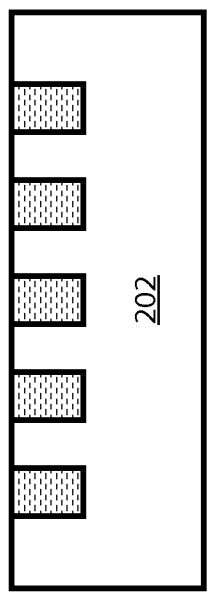
FIG. 6 is a diagram of wiring material and a substrate after planarization, in accordance to one embodiment of the present invention.

FIG. 6 schematically depicts the wiring material 504 and substrate 202 after planarization. One skilled in the art would recognize that the wiring material can be comprised of a variety of electrically conductive materials such as copper (Cu).

Figure 7A:
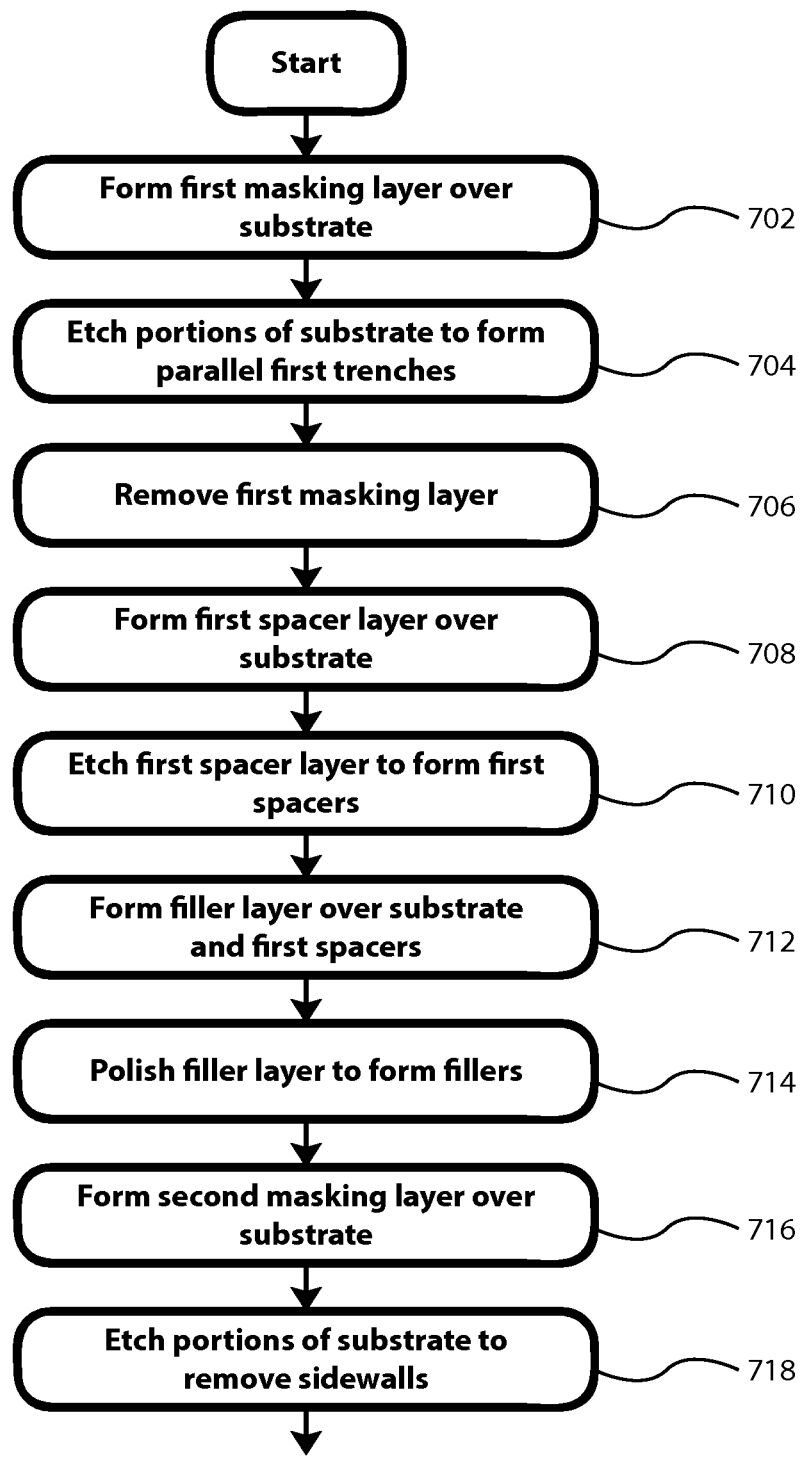
FIG. 7A is a flowchart illustrating elements of an example method for fabricating a memory cell array, in accordance to one embodiment of the present invention.
Figure 7B:
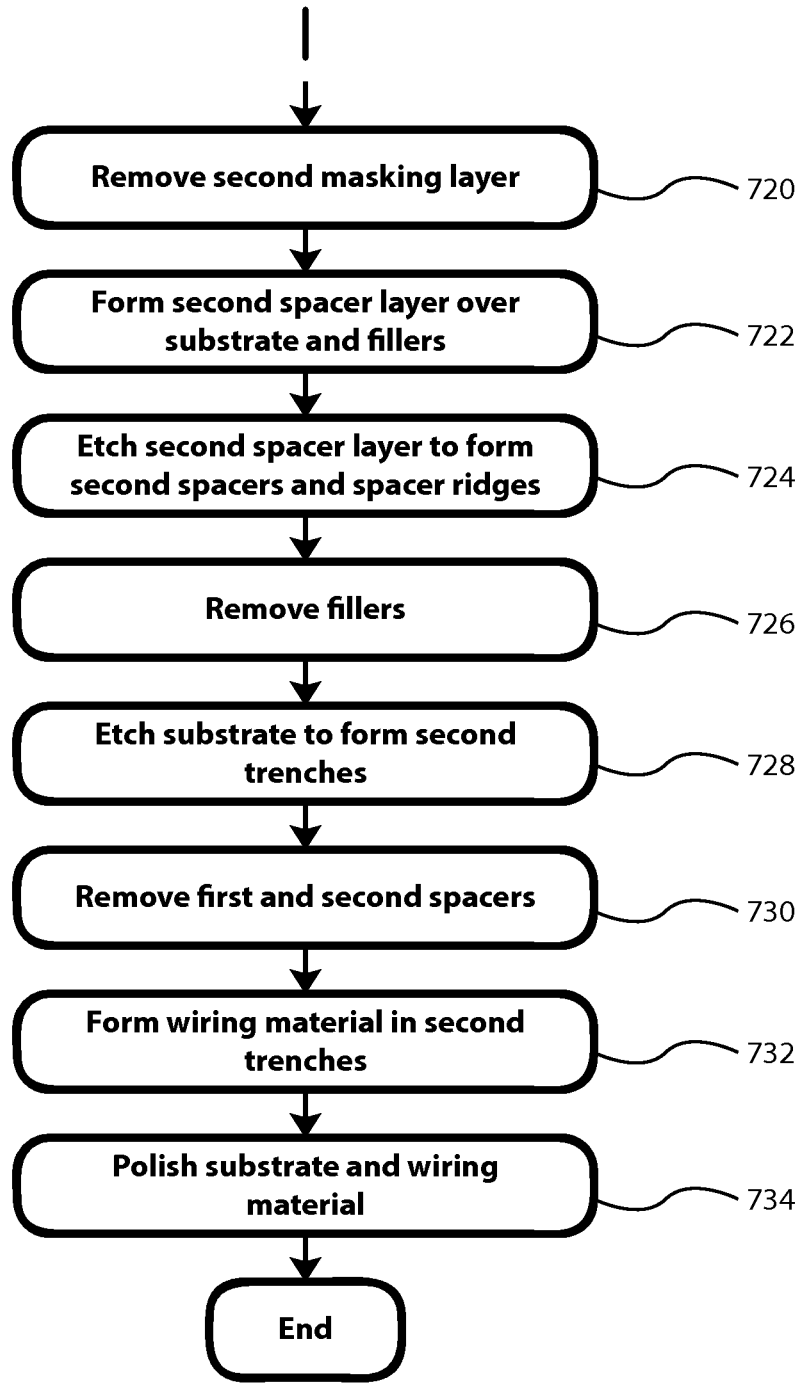
FIG. 7B is a continuation of the flowchart in FIG. 7A.

FIGS. 7A and 7B is a flowchart illustrating an example method for forming the physical wiring of a memory cell array. FIG. 7A and FIG. 7B will be described with reference to items in FIG. 2A through FIG. 6.

The method begins with forming step 702. At forming step 702, the first masking layer 204 is formed over the substrate 202 (FIG. 2A). The first masking layer 204 includes the plurality of gaps exposing the substrate 202. After forming step 702, the method proceeds to etching step 704.

Figure 2B:
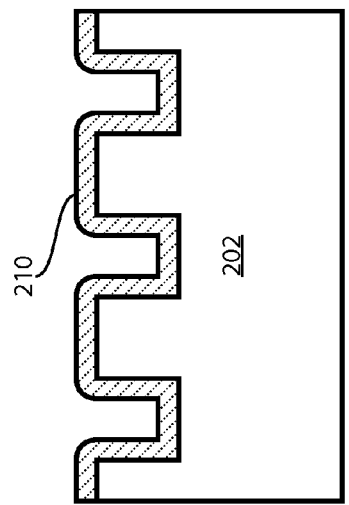
FIG. 2B is a diagram of an intermediary step depicting a plurality of parallel first trenches etched into a substrate, in accordance to one embodiment of the present invention.
Figure 2C:
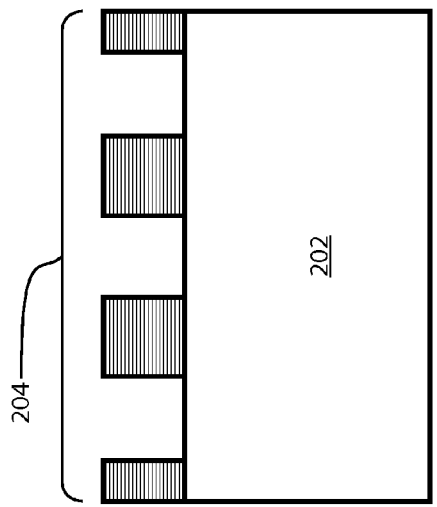
FIG. 2C is a diagram of an intermediary step depicting the substrate including sidewalls, in accordance to one embodiment of the present invention.

At etching step 704, the exposed portions of the substrate are etched to form the plurality of parallel first trenches 206 (FIG. 2B). The portions substrate 202 between each of the parallel first trenches include the sidewalls 208. After etching step 704, the method proceeds to removing step 706. At removing step 706, the first masking layer 204 is removed from the substrate 202 (FIG. 2C). After removing step 706, the method proceeds to forming step 708.

Figure 2D:
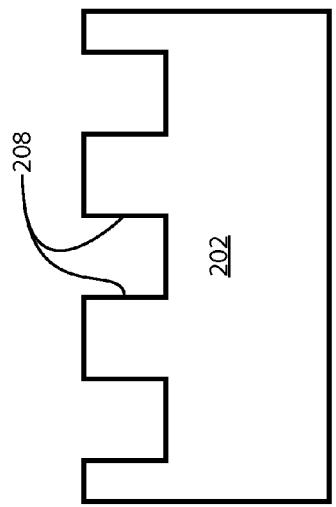
FIG. 2D is a diagram of an intermediary step depicting a first spacer layer deposited on a substrate, in accordance to one embodiment of the present invention.

At forming step 708, the first spacer layer 210 is formed over the substrate 202 (FIG. 2D). After forming step 708, the method proceeds to etching step 710. At etching step 710, the first spacer layer 210 is etched to form the plurality of first spacers 302 adjacent to the sidewalls 208 (FIG. 3A). After etching step 710, the method proceeds to forming step 712.

At forming step 712, the filler layer 304 is formed over the substrate 202 and first spacers 302 (FIG. 3B). After forming step 712, the method proceeds to polishing step 714. At polishing step 714, the filler layer 304 is polished to expose portions of the substrate 202, resulting in the plurality of fillers 306 in the parallel first trenches 206 (FIG. 3C). After polishing step 714, the method proceeds to forming step 716.

At forming step 716, the second masking layer 308 is formed over the substrate 202 (FIG. 3D). The second masking layer 308 includes a gap exposing the portions of the substrate 202 and fillers 306. After forming step 716, the method proceeds to etching step 718.

At etching step 718, the exposed portions of the substrate are etched to form the plurality of parallel first trenches 206 (FIG. 4A). After etching step 718, the method proceeds to removing step 720, continuing on FIG. 7B. At removing step 720, the second masking layer 308 is removed from the substrate 202 (FIG. 4B). After removing step 720, the method proceeds to forming step 722.

At forming step 722, the second spacer layer 402 is formed over the substrate 202 and fillers 306 (FIG. 4C). After forming step 722, the method proceeds to etching step 724. At etching step 724, the second spacer layer 402 is etched to form the plurality of second spacers 404 adjacent to the first spacers 302 (FIG. 4D). The adjacent first and second spacers are in physical contact and result in the plurality of spacer ridges 406. After etching step 724, the method proceeds to removing step 726.

At removing step 726, the fillers 306 are removed (FIG. 5A). One skilled in the art would recognize that the fillers can be removed with a variety of processes including selectively etching the filler material. After removing step 726, the method proceeds to etching step 728.

At etching step 728, portions of the substrate 202 between the spacer ridges 406 are etched forming the plurality of second trenches 502 (FIG. 5B). After etching step 728, the method proceeds to removing step 730. At removing step 730, the first spacers 302 and second spacers 404 are removed from the substrate 202 (FIG. 5C). After removing step 730, the method proceeds to forming step 732.

At forming step 732, the wiring material 504 is formed over the substrate 202 (FIG. 5D). After forming step 732, the method proceeds to polishing step 734. At polishing step 734, the wiring material 504 and substrate 202 are planarized such that the wiring material 504 exists only in the second trenches 502 (FIG. 6). After polishing step 734, the method is complete.

Figure 8B:
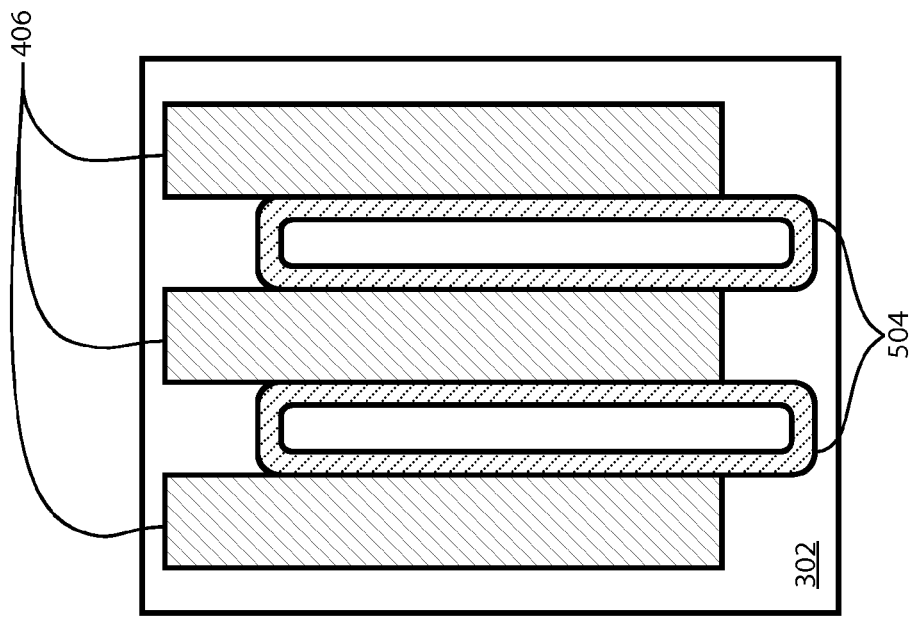
FIG. 8B is a top-down diagram of fillers and second spacers on the substrate, in accordance to one embodiment of the present invention.
Figure 8A:
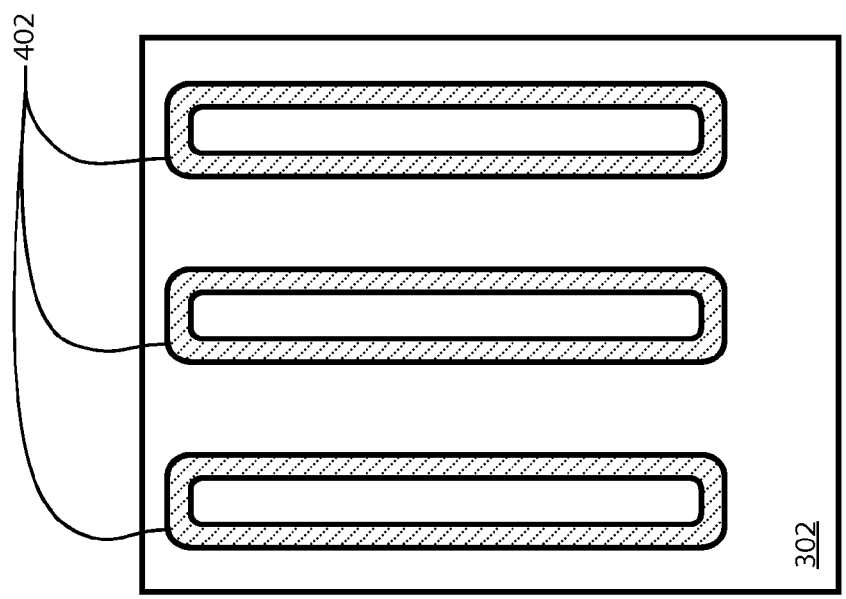
FIG. 8A is a top-down diagram of first spacers on the substrate, in accordance to one embodiment of the present invention.

The diagrams from FIG. 8A through FIG. 8D are top-down views of the device throughout various steps of fabrication, in accordance to one embodiment of the present invention. FIG. 8A is an example top-down diagram of the first spacers 302 on the substrate 202, after etching step 710. FIG. 8B is an example top-down diagram of the fillers 306 and second spacers 404, after etching step 724. In this diagram, the first spacers 302 are obstructed from view by the fillers 306.

Figure 8D:
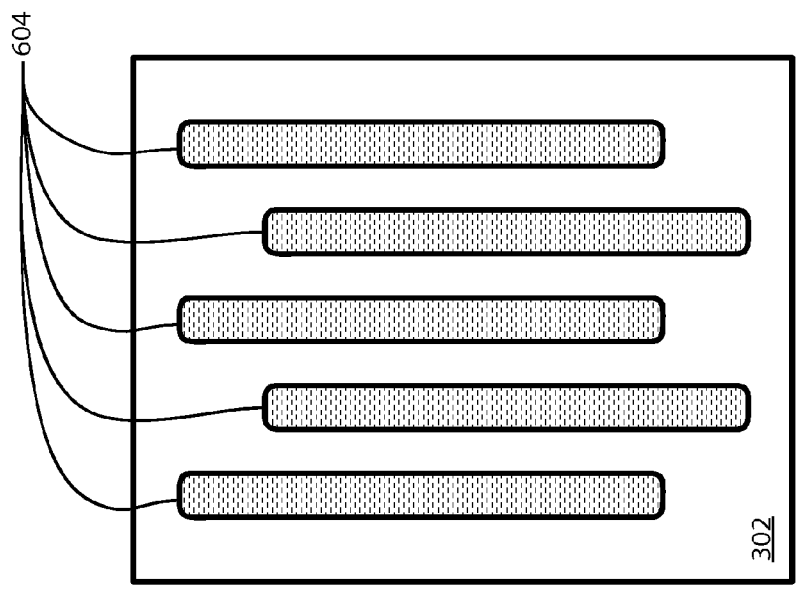
FIG. 8D is a top-down diagram of wiring material in a substrate, in accordance to one embodiment of the present invention.
Figure 8C:
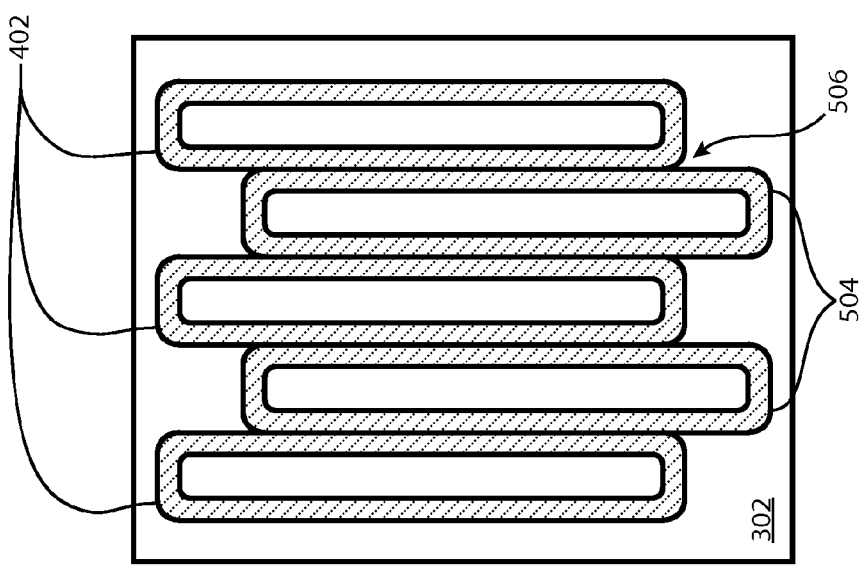
FIG. 8C is a top-down diagram of first spacers and second spacers resulting in spacer ridges, in accordance to one embodiment of the present invention.

FIG. 8C is an example top-down diagram of the first spacers 302 and second spacers 404 resulting in the spacer ridges 406, after removing step 726. FIG. 8D is an example top-down diagram of the wiring material 504 in the substrate, after polishing step 734.

Figure 9B:
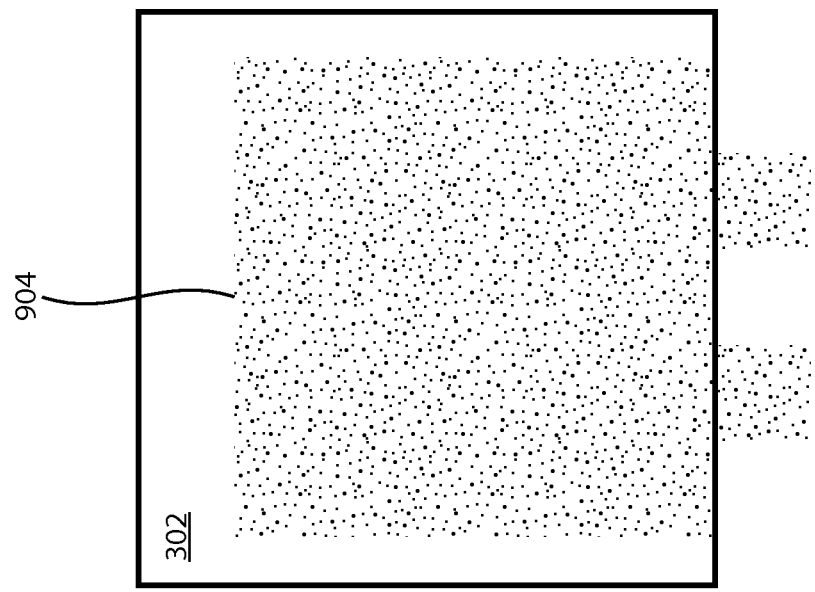
FIG. 9B is a top-down negative mask diagram of a second lithographic process, in accordance to one embodiment of the present invention.
Figure 9A:
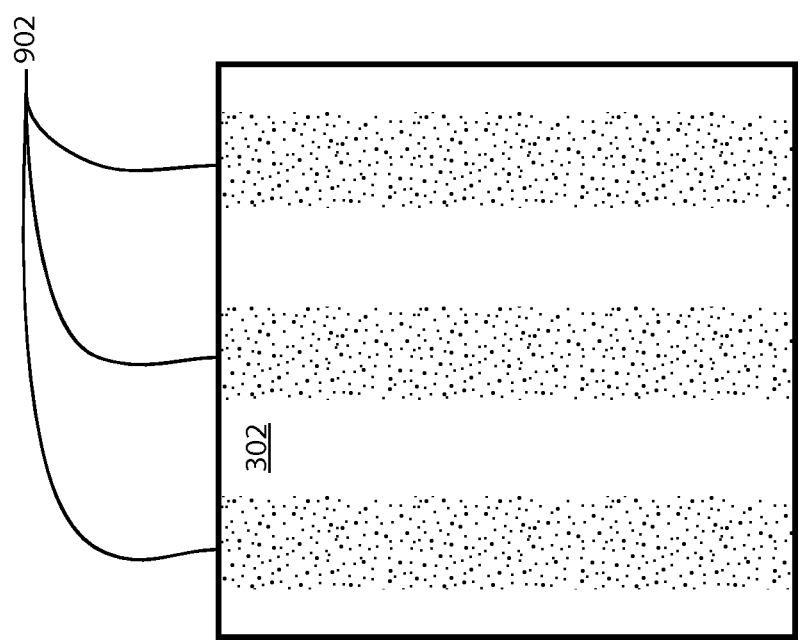
FIG. 9A is a top-down negative mask diagram of a first lithographic process, in accordance to one embodiment of the present invention.

FIG. 9A is a top-down view of an example negative mask diagram of the first lithographic process, in accordance to one embodiment of the present invention. The shaded area 902 displays the portion of substrate to be etched during the first lithographic process. FIG. 9B is a top-down view of an example negative mask diagram of the second lithographic process, in accordance to one embodiment of the present invention. The shaded area 904 displays the portion of substrate to be etched during the second lithographic process.

One skilled in the art would recognize that the above disclosed method may be repeated to form successive layers of wiring on top of each other for three-dimensional memory arrays.

Having described preferred embodiments for a method of fabricating a semiconductor device, it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:
    forming a plurality of parallel first trenches in a substrate using a first lithographic process such that the portions of the substrate adjacent to the parallel first trenches include sidewalls;
    forming a plurality of first spacers adjacent to the sidewalls of the substrate;
    forming a plurality of fillers in the parallel first trenches;
    removing the sidewalls of the substrate, wherein removing the sidewalls includes using a second lithographic process;
    forming a plurality of second spacers adjacent to the first spacers;
    removing the fillers;
    wherein the adjacent first and second spacers in physical contact result in a plurality of spacer ridges.

\* \* \* \* \*